United States Patent
Tsai et al.

(10) Patent No.: US 6,404,064 B1
(45) Date of Patent: Jun. 11, 2002

(54) FLIP-CHIP BONDING STRUCTURE ON SUBSTRATE FOR FLIP-CHIP PACKAGE APPLICATION

(75) Inventors: Ying-Chou Tsai, Hsinchu; Shih-Kuang Chiu, Taichung; Kuo-Liang Mao, Taichung; Chao-Dung Suo, Taichung, all of (TW)

(73) Assignee: Siliconware Precision Industries Co., Ltd. (TW)

( * ) Notice: Subject to any disclaimer, the term of this patent is extended or adjusted under 35 U.S.C. 154(b) by 0 days.

(21) Appl. No.: 09/617,717

(22) Filed: Jul. 17, 2000

(51) Int. Cl.[7] .................. H01L 23/48; H01L 23/52; H01L 29/40; H01L 21/44; H01L 21/48; H01L 21/50

(52) U.S. Cl. .............. 257/779; 257/772; 257/778; 257/786; 438/108; 438/612

(58) Field of Search ................... 257/772, 778, 257/779, 786; 438/108, 612

(56) References Cited

U.S. PATENT DOCUMENTS

| | | | |
|---|---|---|---|
| 5,011,066 A | 4/1991 | Thompson | 228/180 |
| 5,489,750 A | 2/1996 | Sakemi et al. | 174/261 |
| 5,535,101 A | 7/1996 | Miles et al. | 367/808 |
| 5,637,832 A | 6/1997 | Danner | 174/260 |
| 5,783,865 A | 7/1998 | Higashiguchi et al. | 257/774 |
| 5,834,849 A | 11/1998 | Lane | 257/786 |
| 5,915,977 A | 6/1999 | Hembree et al. | 439/74 |
| 5,926,694 A | 7/1999 | Chigawa et al. | 438/106 |
| 6,034,427 A | * 3/2000 | Lan et al. | 257/698 |
| 6,229,711 B1 | * 5/2001 | Yoneda | 361/760 |

FOREIGN PATENT DOCUMENTS

| JP | 403004545 A | * 1/1991 | H01L/21/60 |
|---|---|---|---|

* cited by examiner

*Primary Examiner*—Chandra Chaudhari
*Assistant Examiner*—Nema Berezny
(74) *Attorney, Agent, or Firm*—Peter F. Corless; Steven M. Jensen; Edwards & Angell, LLP

(57) ABSTRACT

A flip-chip bonding structure on substrate for flip-chip package application is proposed, on which solder bumps can be bonded for electrically coupling a flip chip to the substrate. The proposed flip-chip bonding structure is characterized in that its solder-bump pads can be dimensionally-invariable irrespective of a positional deviation in solder mask due to misalignment. Moreover, the proposed flip-chip bonding structure can help allow each attached solder bump to be reduced in horizontal extent as compared to the prior art, so that neighboring solder bumps would be less likely short-circuited to each other and flip-chip underfill can be more easily implemented.

12 Claims, 6 Drawing Sheets

FIG. 1A (PRIOR ART)
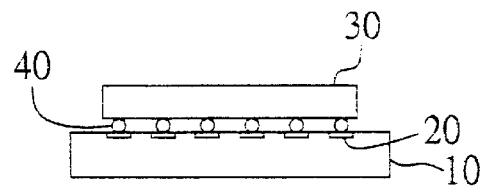
FIG. 1B (PRIOR ART)
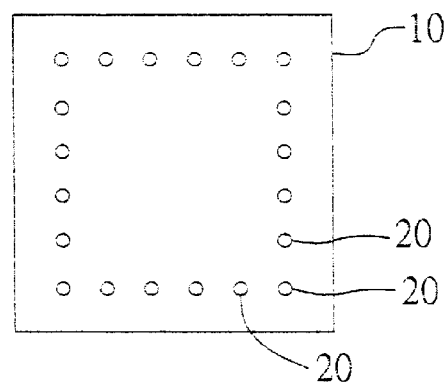
FIG. 2A (PRIOR ART)   FIG. 2B (PRIOR ART)
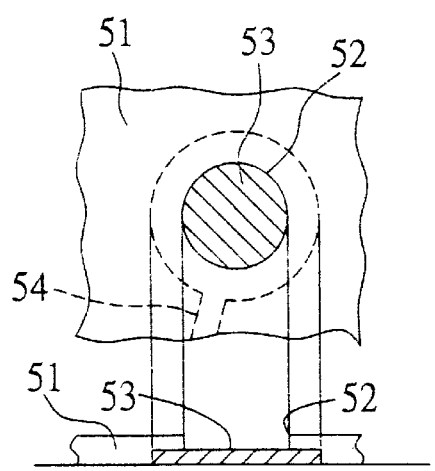 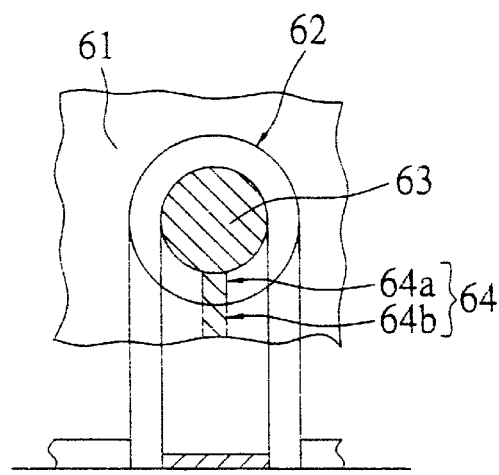

FLIP-CHIP BONDING STRUCTURE ON SUBSTRATE FOR FLIP-CHIP PACKAGE APPLICATION

BACKGROUND OF THE INVENTION

1. Field of the Invention

This invention relates to FCCSP (Flip-Chip Chip-Scale Package) technology, and more particularly, to a flip-chip bonding structure on substrate for flip-chip package application, on which solder bumps can be bonded for electrically coupling a flip chip to the substrate.

2. Description of Related Art

FCCSP (Flip-Chip Chip Scale Package) is an advanced type of integrated circuit packaging technology that allows the overall package size to be made very compact. By FCCSP, the semiconductor chip is mounted in an upside-down manner over a substrate formed with an array of solder-bump pads, and which is mechanically bonded and electrically coupled to the substrate by means of solder bumps. A conventional flip-chip package configuration is schematically depicted in the following with reference to FIGS. 1A–1B.

FIG. 1A shows a schematic sectional view of a conventional flip-chip package configuration. As shown, the flip-chip package configuration includes a substrate 10 which is provided with an array of solder-bump pads 20 on the front surface thereof. As shown in the top view of FIG. 1B, these solder-bump pads 20 are arranged on the periphery of the substrate 10. By the FCCSP technology, a semiconductor chip 30 is mounted in an upside-down manner over the substrate 10 (i.e., with its circuit surface facing down against the front surface of the substrate 10), and which is mechanically bonded and electrically coupled to the substrate 10 by means of solder bumps 40.

Conventionally, there are many various ways of making the solder-bump pads 20, including, for example, the SMD (Solder Mask Define) method shown in FIG. 2A and the NSMD (Non-SMD) method shown in FIG. 2B.

Referring to FIG. 2A, the SMD method includes the use of a solder mask 51 having a circularly-shaped opening 52 to define solder-bump pad location. Further, a circularly-shaped electrically-conductive layer 53 is formed within the circularly-shaped mask opening 52 to serve as the intended solder-bump pad, and which is connected to an electrically-conductive trace 54.

The SMD method has the benefit of easy fabrication. However, one drawback to the SMD method is that it has poor routability to the electrically-conductive trace 54. One solution to the poor-routability problem is to use the NSMD method.

Referring to FIG. 2B, the NSMD method includes the use of a solder mask 61 having a circularly-shaped opening 62 to define solder-bump pad location. Further, a circularly-shaped electrically-conductive layer 63 is formed within the circularly-shaped mask opening 62, and an elongated electrically-conductive trace 64 is connected to the circularly-shaped electrically-conductive layer 63. The electrically-conductive trace 64 has an uncovered part 64a exposed through the mask opening 62 and a covered part 64b extending into the underneath of the solder mask 61.

It should be noted that, in the case of FIG. 2B, the combined surface area of the electrically-conductive layer 63 and the exposed portion 64a of the electrically-conductive trace 64 collectively serves as the intended solder-bump pad. In other words, the wetted solder would be spread over all exposed electrically-conductive surfaces, including the electrically-conductive trace 64 and the exposed portion 64a of the electrically-conductive trace 64.

The NSMD method has the benefit of allowing good routability to the electrically-conductive traces interconnecting the solder-bump pads on the substrate. One drawback to the NSMD method, however, is that the overall pad surface area would be affected by a positional deviation of the solder mask due to misalignment. This problem is described in more details in the following.

Theoretically, when a fixed amount of solder is wetted on a solder-bump pad, the degree of solder collapse would be substantially proportional to the overall surface area of the solder-bump pad. For this sake, in an array of solder-bump pads, if some pads are different in surface area from the others, the resulted array of solder bumps on these solder-bump pads would be non-coplanarized, which would lead to the problem of package warpage.

In addition, since the array of solder bumps are typically highly densified, any misalignment that causes the solder-bump pads to be increased in surface area would cause the attached solder bumps to be more horizontally extended, which would result in a short-circuit problem and a flip-chip underfill problem as illustratively depicted in the following with reference to FIG. 3.

FIG. 3 is a schematic diagram showing two neighboring solder-bump pads 71, 72 on which two respective solder bumps 81, 82 are formed. In the example of FIG. 3, the two neighboring solder-bump pads 71, 72 are circularly-shaped, which are fabricated through the NSMD method.

In FIG. 3, assume P represents the pitch between the two neighboring solder-bump pads 71, 72; D represents the diameter of each of the circularly-shaped solder-bump pads 71, 72; W represents the diameter of each of the solder bumps 81, 82; and G represents the width of the gap between the two solder bumps 81, 82. In a typical FCCSP layout, P=125 $\mu$m, D=75 $\mu$m, and W=93 $\mu$m; and therefore, G=32 $\mu$m. After reflow, however, the solder bumps 81, 82 will be further spread out horizontally, thus increasing W to about 105 $\mu$m; and as a result, G is reduced to only about 20 $\mu$m.

The narrowing of the gap G between the neighboring solder bumps 81, 82 would undesirably result in two problems. First, it would make the neighboring solder bumps 81, 82 more likely to be short-circuited to each other; and second, the narrowed gap G between the neighboring solder bumps 81, 82 would make subsequent flip-chip underfill process very difficult to implement.

It can be seen from FIG. 4A that, for the SMD-type of solder-bump pad shown in FIG. 2A (which includes only the circularly-shaped electrically-conductive layer 53), a positional deviation in the solder mask 51 would not affect the overall pad surface area.

However, for the NSMD-type of solder-bump pad shown in FIG. 2B (which includes the circularly-shaped electrically-conductive layer 63 and the exposed portion 64a of the electrically-conductive trace 64), it can be seen from FIG. 4B that a downward positional deviation in the solder mask 61 would cause part of the should-be-covered portion 64b of the electrically-conductive trace 64 to be exposed, thus giving an additional surface area to the solder-bump pad.

As mentioned earlier, a larger solder-bump pad would undesirably cause the attached solder bump to be more collapsed to a lower height, thus resulting a non-coplanarity problem to the resulted array of solder bumps.

Related patents are partly listed in the following:

U.S. Pat. No. 5,834,849 entitled "HIGH DENSITY INTEGRATED CIRCUIT PAD STRUCTURES".

U.S. Pat. No. 5,637,832 entitled "SOLDER BALL ARRAY AND METHOD OF PREPARATION";

U.S. Pat. No. 5,783,865 entitled "WIRING SUBSTRATE AND SEMICONDUCTOR DEVICE";

U.S. Pat. No. 5,915,977 entitled "SYSTEM AND INTERCONNECT FOR MAKING TEMPORARY ELECTRICAL CONNECTIONS WITH BUMPED SEMICONDUCTOR COMPONENTS";

U.S. Pat. No. 5,535,101 entitled "LEADLESS INTEGRATED CIRCUIT PACKAGE";

U.S. Pat. No. 5,011,066 entitled "ENHANCED COLLAPSE SOLDER INTERCONNECTION".

U.S. Pat. No. 5,926,694 entitled "SEMICONDUCTOR DEVICE AND A MANUFACTURING METHOD THEREOF"; and U.S. Pat. No. 5,489,750 entitled "METHOD OF MOUNTING AN ELECTRONIC PART WITH BUMPS ON A CIRCUIT BOARD".

None of the above-listed patents, however, teach how to retain a solder-bump pad at its predefined surface area when the solder mask is deviated in position due to misalignment.

SUMMARY OF THE INVENTION

It is therefore an objective of this invention to provide a flip-chip bonding structure on substrate for flip-chip package application, which allows each solder-bump pad to retain predefined surface area even when solder mask is deviated in position due to misalignment.

It is another objective of this invention to provide a flip-chip bonding structure on substrate for flip-chip package application, which can help allow each attached solder bump to be reduced in horizontal extent as compared to the prior art, so that the attached solder bumps would be less likely short-circuited to each other.

It is still another objective of this invention to provide a flip-chip bonding structure on substrate for flip-chip package application, which can help allow each attached solder bump to be reduced in horizontal extent as compared to the prior art, so that the gap between neighboring solder bumps can be increased as compared to the prior art to facilitate flip-chip underfill.

In accordance with the foregoing and other objectives, the invention proposes a new flip-chip bonding structure on substrate for flip-chip package application.

Broadly defined, the flip-chip bonding structure of the invention comprises: (a) a solder mask having an opening shaped with an opposite pair of parallel straight edges including a first straight edge and a second straight edge; the location of the solder mask opening being subjected to deviation within a statistically-determined maximum positional deviation; and (b) an electrically-conductive layer which is predefined to have an exposed portion uncovered by the solder mask to serve as solder-bump pad and a pair of oppositely-adjoined unexposed portions including a first unexposed portion and a second unexposed portion covered by the solder mask to serve as electrically-conductive traces.

It is a key point of the invention that the solder-bump pad includes a first exposed parallelogram area adjoining the first straight edge of the solder mask opening, with an extent within the maximum positional deviation of the solder mask; a second exposed parallelogram area adjoining the second straight edge of the solder mask opening, with an extent within the maximum positional deviation of the solder mask; and an intermediate area between the first exposed parallelogram area and the second exposed parallelogram area; and the electrically-conductive traces include a first unexposed parallelogram area contiguous to the first exposed parallelogram area and adjoining the first straight edge of the solder mask opening, with an extent within the maximum positional deviation of the solder mask; and a second unexposed parallelogram area contiguous to the second exposed parallelogram area and adjoining the second straight edge of the solder mask opening, with an extent within the maximum positional deviation of the solder mask.

The foregoing flip-chip bonding structure of the invention can help retain predefined pad surface area even when the solder mask is deviated in position due to misalignment. Moreover, the flip-chip bonding structure of the invention can help allow each attached solder bump to be reduced in horizontal extent as compared to the prior art, so that neighboring solder bumps would be less likely short-circuited to each other and flip-chip underfill can be more easily implemented.

BRIEF DESCRIPTION OF DRAWINGS

The invention can be more fully understood by reading the following detailed description of the preferred embodiments, with reference made to the accompanying drawings, wherein:

FIG. 1A (PRIOR ART) shows a schematic sectional view of a conventional flip-chip package configuration;

FIG. 1B (PRIOR ART) shows a schematic top view of the substrate shown in FIG. 1A on which an array of solder-bump pads are provided, FIG. 2A (PRIOR ART) shows a schematic top view of an SMD-type of flip-chip bonding structure;

FIG. 2B (PRIOR ART) shows a schematic top view of an NSMD-type of flip-chip bonding structure, FIG. 3 (PRIOR ART) is a schematic sectional diagram of a neighboring pair of solder bumps on substrate;

DETAILED DESCRIPTION OF PREFERRED EMBODIMENTS

In accordance with the invention, various preferred embodiments are disclosed in full details in the following with reference to FIG. 5, FIG. 6, FIG. 7, FIG. 8, FIG. 9, and FIGS. 10A–10C.

Figure 5:
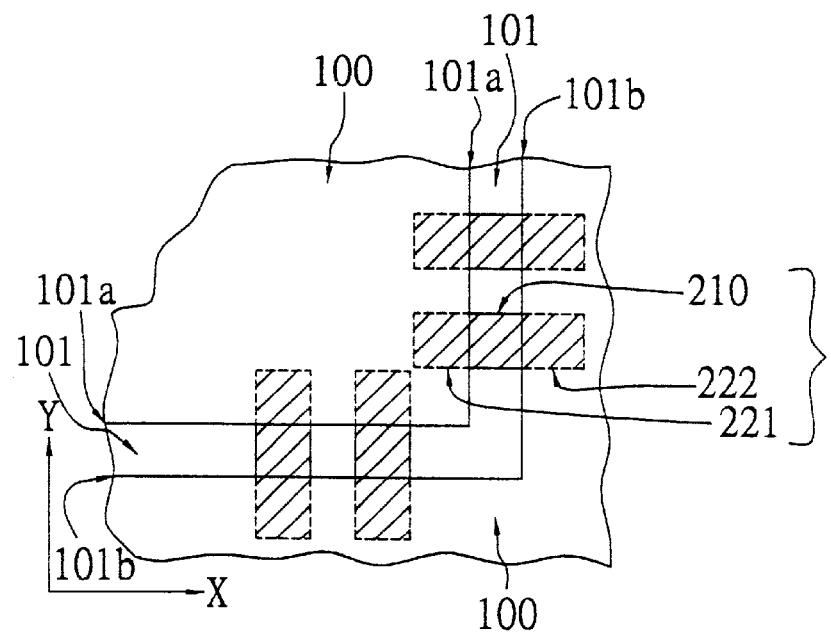
FIG. 5 is a schematic diagram of part of a substrate on which the flip-chip bonding structure of the invention is utilized to provide an array of solder-bump pads.

FIG. 5 is a schematic diagram of part of a substrate on which the flip-chip bonding structure of the invention is utilized to provide an array of solder-bump pads. As shown, the flip-chip bonding structure of the invention includes the use of a solder mask 100 formed with an elongated opening 101 along the periphery of the underlying substrate (not shown) for defining the location of an array of squarely-shaped solder-bump pads 210 each adjoining a pair of electrically-conductive traces 221, 222 extending into the beneath of the solder mask 100 (the electrically-conductive traces 221, 222 are drawn in dashed lines in FIG. 5). It is a key point of the invention that the mask opening 101 is shaped with opposite parallel straight edges 101a, 101b.

Figure 6:
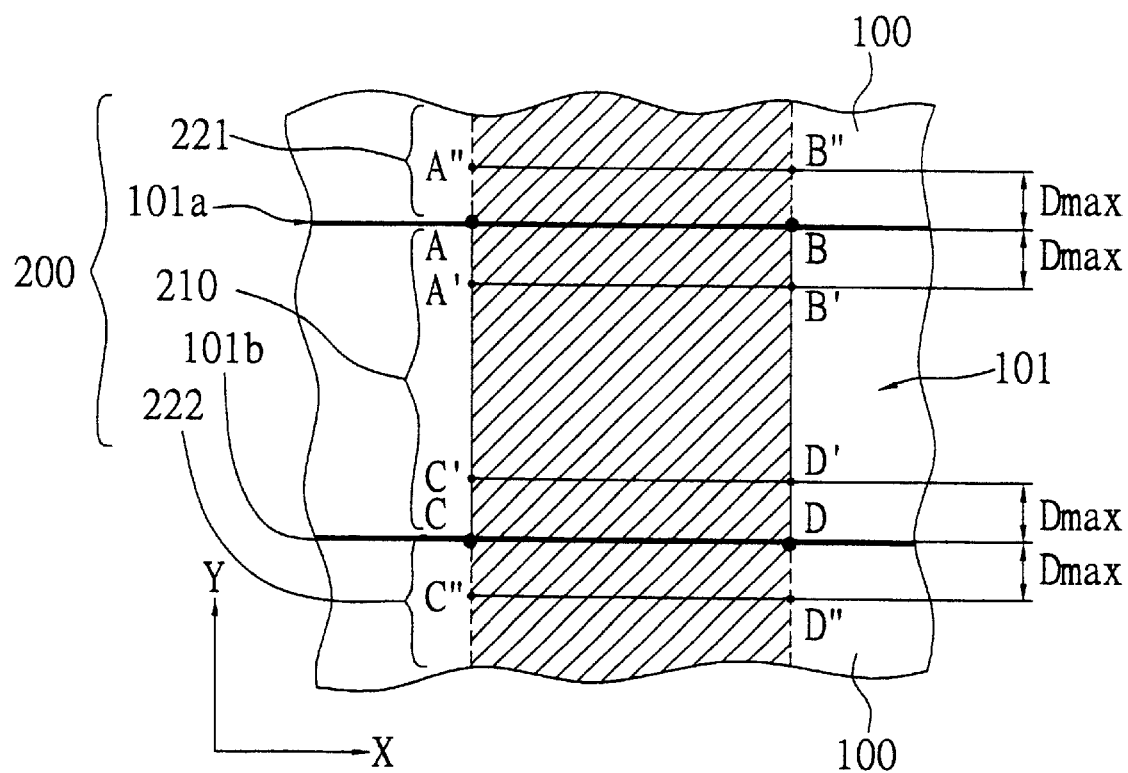
FIG. 6 is a schematic diagram used to depict the fundamental construction of the flip-chip bonding structure of the invention.

FIG. 6 is a schematic diagram used to depict the fundamental construction of the flip-chip bonding structure of the invention. As shown, each solder-bump pad 210 and its adjoining pair of electrically-conductive traces 221, 222 are integrally formed from a continuous band of electrically-conductive layer 200 which is partly exposed through the solder-mask opening 101 (the exposed part serves as the solder-bump pad 210) and partly covered by the solder mask 100 (the covered part serves as the electrically-conductive traces 221, 222). In FIG. 6, the predefined surface area for the solder-bump pad 210 is represented by □ABCD.

Assume that, due to solder mask misalignment, the maximum possible positional deviation of the solder mask 100 is $D_{max}$. The value of $D_{max}$ can be obtained from statistical analysis on measured positional errors from actual fabrications.

It is another key point of the invention that the solder-bump pad 210 should include a first parallelogram area, preferably a rectangular area as represented by □AA'BB' in FIG. 6, extending from the first straight edge 101a of the mask opening 101 by a distance at least equal to or greater than the maximum possible positional deviation $D_{max}$ of the solder mask 100 (i.e., the sides AA' and BB' should be at least equal to or greater in length than $D_{max}$); and should further include a second parallelogram area, preferably a rectangular area as represented by □CC'DD' in FIG. 6, extending from the second straight edge 101b of the mask opening 101 by a distance at least equal to or greater than the maximum possible positional deviation $D_{max}$ of the solder mask 100 (i.e., the sides CC' and DD' should be at least equal to or greater in length than $D_{max}$).

In addition, the first electrically-conductive trace 221 should correspondingly include a contiguous rectangular area, as represented by □AA"BB" in FIG. 6, adjoining the first exposed rectangular area □AA'BB' and extending from the first straight edge 101a of the mask opening 101 by a distance at least equal to or greater than the maximum possible positional deviation $D_{max}$ of the solder mask 100 (i.e., the sides AA" and BB" should be at least equal to or greater than $D_{max}$); and in a similar manner, the second electrically-conductive trace 222 should correspondingly include a contiguous rectangular area, as represented by □CC"DD" in FIG. 6, adjoining the second exposed rectangular area □CC'DD' and extending from the second straight edge 101b of the mask opening 101 by a distance at least equal to or greater than the maximum possible positional deviation $D_{max}$ of the solder mask 100 (i.e., the sides CC" and DD" should be at least equal to or greater than $D_{max}$).

Beside these four areas □AA'BB', □AA"BB", □CC'DD', □CC"DD", all the other areas of the electrically-conductive layer 200, i.e., □A'B'C'D' and the mask-covered areas beyond □AA"BB" and □CC"DD", can be arbitrarily shaped in accordance with design choice.

Figure 7:
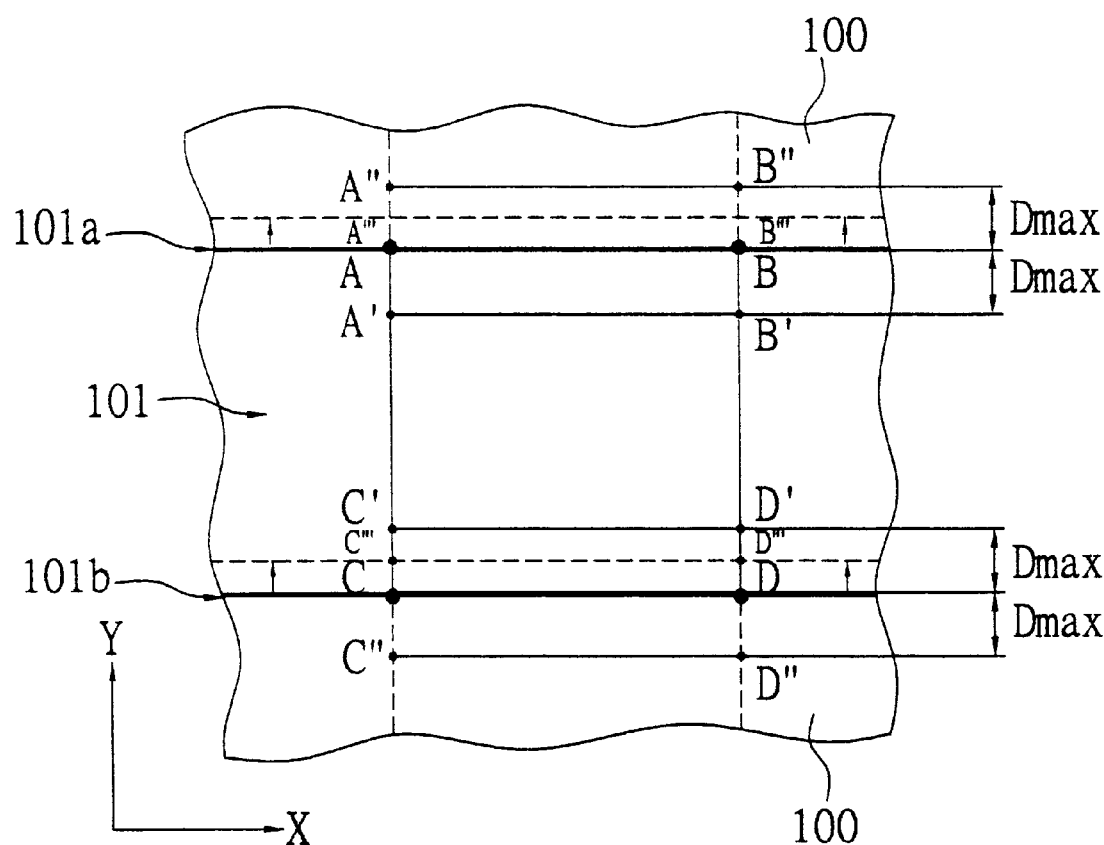
FIG. 7 shows the same of FIG. 6 except when the solder mask is deviated in position due to misalignment.

It can be clearly seen from FIG. 7 that, if the solder mask 100 is deviated in position in the X-axis direction due to misalignment, the predefined surface area □ABCD for the solder-bump pad 210 would be unchanged in any way. On the other hand, if the solder mask 100 is deviated in position in the Y-axis direction due to misalignment (assume the first straight edge 101a of the mask opening 101 is deviated to the dashed line A'"B'" and the second straight edge 101b of the same is deviated to the dashed line C"D'"), it will cause the should-be-covered surface area □AA"BB" to be partly exposed (the exposed part is represented by □AA'"BB'"), and meanwhile cause the same amount of surface area in □CC'DD' to be covered up (the covered part is represented by □CC'"DD'"). Due to the parallellogram layout of □AA"BB" and □CC"DD", it would be that □AA'"BB'"= □CC'"DD'", and as a result, the overall surface area □A'"B'"C'"D'" (which is now used to serve as the solder-bump pad) would be nonetheless the same as the predefined pad surface area □ABCD.

Figure 8:
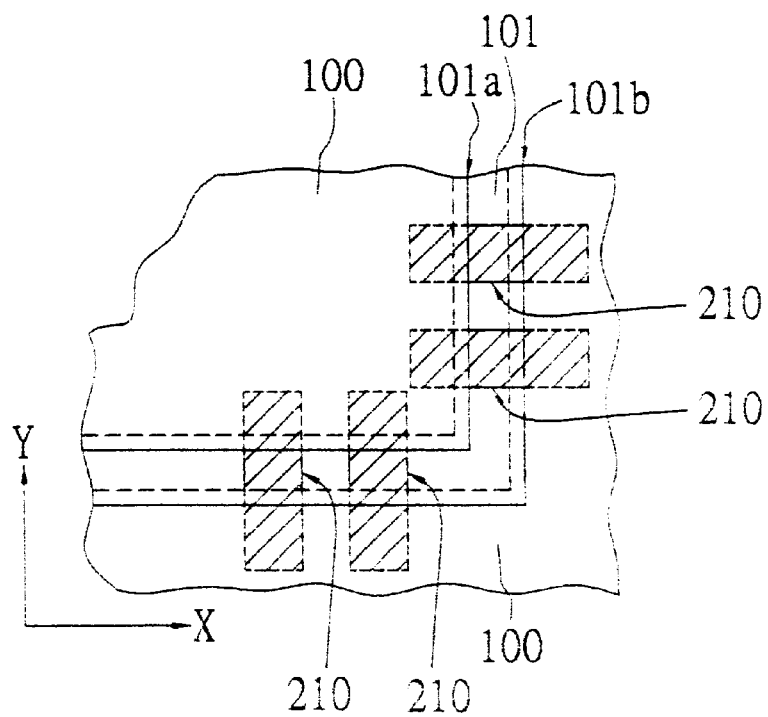
FIG. 8 shows the same of FIG. 5 except when the solder mask is deviated in position due to misalignment.

Therefore, as shown in FIG. 8, for the array of solder-bump pads 210 shown in FIG. 5, when the solder mask 100 is deviated in position in both the X-axis and Y-axis directions, all the solder-bump pad 210 in the longwise row as well as in the crosswise row would retain predefined surface area.

The squarely-shaped solder-bump pad 210 shown in FIG. 6 in addition can allow the solder bump (not shown) attached thereon to be reduced in horizontal extent. The reason is explained in the following with reference to FIG. 9.

Figure 9:
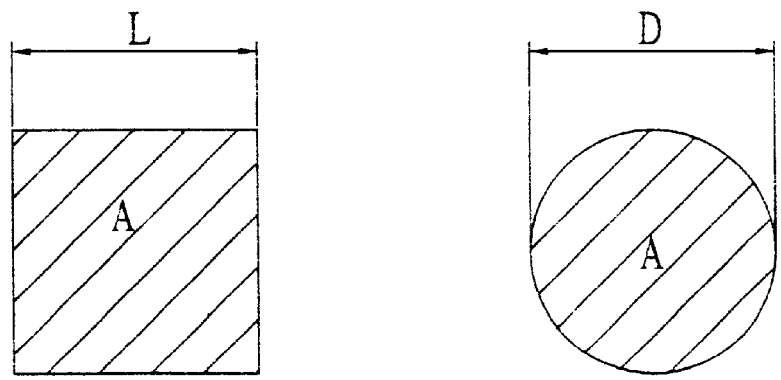
FIG. 9 is a schematic diagram used to depict how a squarely-shaped solder-bump pad provided by the invention is less in horizontal extent than a circularly-shaped solder-bump pad provided of the same surface area.

As shown in FIG. 9, assume it is required to provide a specifically-predefined surface area A to a solder-bump pad, then it is apparent that a squarely-shaped pad design can provide a smaller horizontal extent than a circularly-shaped pad design. In FIG. 9, assume the squarely-shaped pad has a side length L, while the circularly-shaped pad has a diameter D; then, if the squarely-shaped pad is equal in surface area as the circularly-shaped pad, i.e., $A=L^2=\pi*(D/2)^2$, it can be deduced that $L=0.89*D$.

For example, a specified surface area of 6400 $\mu m^2$ (square micrometer) requires a circularly-shaped pad of a diameter of 90 $\mu$m (micrometer) to realize; whereas, it can be realized by a squarely-shaped pad of a side length of only about 80 $\mu$m.

Figure 3:
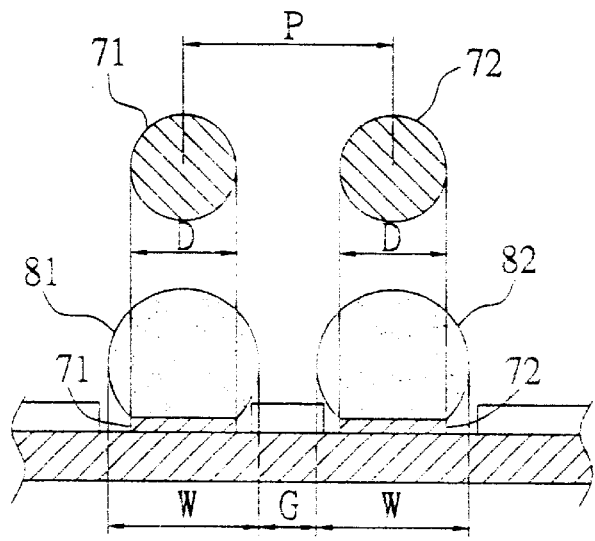
Figures 4A, 4B:
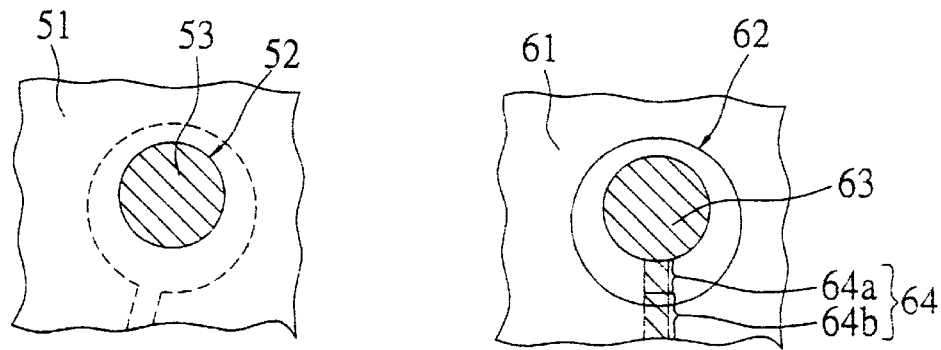
FIG. 4A (PRIOR ART) shows the SMD-type of flip-chip bonding structure of FIG. 2A when solder mask is deviated in position due to misalignment.
FIG. 4B (PRIOR ART) shows the NSMD-type of flip-chip bonding structure of FIG. 2B when solder mask is deviated in position due to misalignment.

Accordingly, given a specifically-predefined pad surface area, the squarely-shaped solder-bump pad shown in FIG. 6 would be less in horizontal extent than a circularly-shaped solder-bump pad of the prior art shown in FIG. 3. Therefore, the use of an array of such squarely-shaped solder-bump pads would allow the gap between neighboring solder bumps to be significantly increased as compared to the use of circularly-shaped solder-bump pads.

For example, in the case of the prior art of FIG. 3, if the circularly-shaped solder-bump pads are replaced with above-mentioned squarely-shaped solder-bump pads, the pad's horizontal extent can be reduced from D=75 $\mu$m (surface area=4400 $\mu m^2$) to about 66 $\mu$m. As a result, the gap width G between the neighboring solder bumps 81, 82 can be increased from G=20 $\mu$m to about 29 $\mu$m, which is a considerable 45% addition that would significantly reduce the possibility of short-circuit between the solder bumps 81, 82 and help subsequent flip-chip underfill process more easily to implement.

Figure 10A:
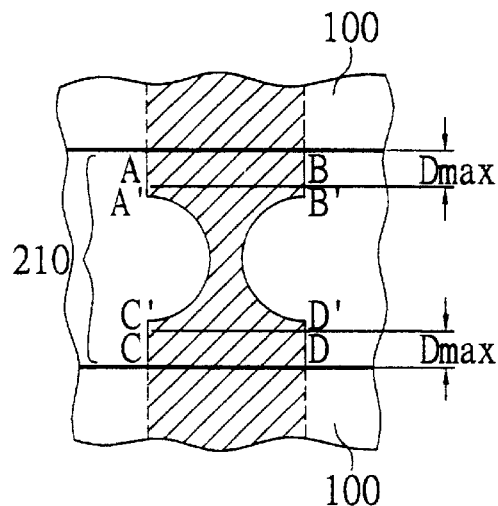
FIGS. 10A–10C are schematic diagrams showing three other various embodiments of the invention.
Figure 10B:
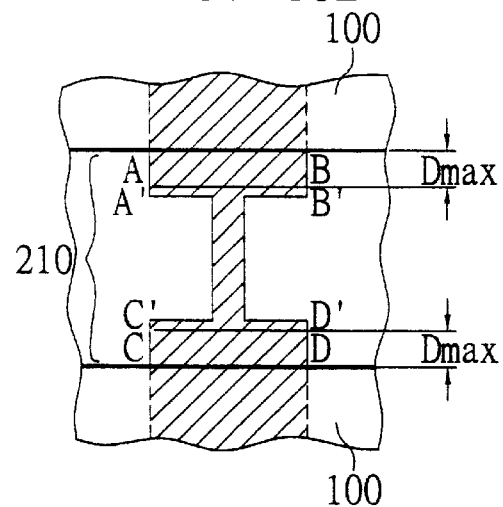
Figure 10C:
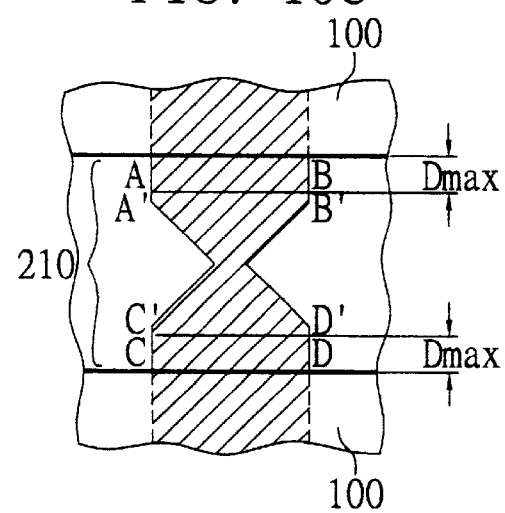

FIGS. 10A–10C are schematic diagrams of three other various embodiments of the invention. In each of these embodiments, the solder-bump pad 210 is constricted in the intermediate area □A'B'C'D' for the purpose of preventing solder bump short-circuit to neighboring ones.

FIG. 10A shows a concavely-shaped constriction layout to the intermediate area □A'B'C'D' of the solder-bump pad 210. It is to be noted that the overall surface area of the solder-bump pad 210 should comply with predefined specifications. FIG. 10B shows a rectangularly-shaped constriction layout to the intermediate area □A'B'C'D'. FIG. 10C shows a triangularly-shaped constriction layout to the intermediate area □A'B'C'D'.

Of the foregoing three embodiments of FIGS. 10A–10C, the embodiment of FIG. 10A is mostly preferable since the rounded edges of the concavely-constricted part would allow optimally smooth reflow to the solder bump attached thereon.

In conclusion, the invention provides a flip-chip bonding structure that can retain predefined pad surface area even when the solder mask is deviated in position due to misalignment. Moreover, it can help allow each attached solder bump to be reduced in horizontal extent as compared to the prior art, so that neighboring solder bumps would be less likely short-circuited to each other. Still moreover, it can help allow each attached solder bump to be reduced in horizontal extent as compared to the prior art, so that the gap between neighboring solder bumps can be increased as compared to the prior art to facilitate the proceeding of flip-chip underfill. The invention is therefore more advantageous to use than the prior art.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A flip-chip bonding structure on a substrate for flip-chip application, which comprises:
    a solder mask having an opening shaped with an opposite pair of parallel straight edges including a first straight edge and a second straight edge; the location of the solder mask opening being subjected to deviation within a statistically-determined maximum positional deviation; and
    an electrically-conductive layer which is predefined to have an exposed portion uncovered by the solder mask to serve as solder-bump pad and a pair of oppositely-adjoined unexposed portions including a first unexposed portion and a second unexposed portion covered by the solder mask to serve as electrically-conductive traces;
    wherein,
    the solder-bump pad includes:
        a first exposed parallelogram area adjoining the first straight edge of the solder mask opening, with an extent within the maximum positional deviation of the solder mask;
        a second exposed parallelogram area adjoining the second straight edge of the solder mask opening, with an extent within the maximum positional deviation of the solder mask; and
        an intermediate area between the first exposed parallelogram area and the second exposed parallelogram area;
    and wherein
    the electrically-conductive traces include:
        a first unexposed parallelogram area contiguous to the first exposed parallelogram area and adjoining the first straight edge of the solder mask opening, with an extent within the maximum positional deviation of the solder mask; and
        a second unexposed parallelogram area contiguous to the second exposed parallelogram area and adjoining the second straight edge of the solder mask opening, with an extent within the maximum positional deviation of the solder mask.

2. The flip-chip bonding structure of claim 1, wherein the first and second exposed parallelogram areas and the first and second unexposed parallelogram areas are each a rectangular area.

3. The flip-chip bonding structure of claim 1, wherein the solder-bump pad is squarely shaped.

4. The flip-chip bonding structure of claim 1, wherein the intermediate area of the solder-bump pad is constricted.

5. The flip-chip bonding structure of claim 4, wherein the constricted intermediate area of the solder-bump pad is concavely shaped.

6. The flip-chip bonding structure of claim 4, wherein the constricted intermediate area of the solder-bump pad is rectangularly shaped.

7. The flip-chip bonding structure of claim 4, wherein the constricted intermediate area of the solder-bump pad is triangularly shaped.

8. A flip-chip bonding structure on a substrate for flip-chip application, which comprises:
    a solder mask having an opening shaped with an opposite pair of parallel straight edges including a first straight edge and a second straight edge; the location of the solder mask opening being subjected to deviation within a statistically-determined maximum positional deviation; and
    an electrically-conductive layer which is predefined to have a squarely-shaped exposed portion uncovered by the solder mask to serve as solder-bump pad and a pair of oppositely-adjoined unexposed portions including a first unexposed portion and a second unexposed portion covered by the solder mask to serve as electrically-conductive traces;
    wherein,
    the squarely-shaped solder-bump pad includes:
        a first exposed rectangular area adjoining the first straight edge of the solder mask opening, with an extent within the maximum positional deviation of the solder mask;
        a second exposed rectangular area adjoining the second straight edge of the solder mask opening, with an extent within the maximum positional deviation of the solder mask; and
        an intermediate area between the first exposed rectangular area and the second exposed rectangular area;
    and wherein
    the electrically-conductive traces include:
        a first unexposed rectangular area contiguous to the first exposed rectangular area and adjoining the first straight edge of the solder mask opening, with an extent within the maximum positional deviation of the solder mask; and
        a second unexposed rectangular area contiguous to the second exposed rectangular area and adjoining the second straight edge of the solder mask opening, with an extent within the maximum positional deviation of the solder mask.

9. A flip-chip bonding structure on a substrate for flip-chip application, which comprises:

a solder mask having an opening shaped with an opposite pair of parallel straight edges including a first straight edge and a second straight edge; the location of the solder mask opening being subjected to deviation within a statistically-determined maximum positional deviation; and an electrically-conductive layer which is predefined to have an exposed portion uncovered by the solder mask to serve as solder-bump pad and a pair of oppositely-adjoined unexposed portions including a first unexposed portion and a second unexposed portion covered by the solder mask to serve as electrically-conductive traces;

wherein, the solder-bump pad includes:

a first exposed rectangular area adjoining the first straight edge of the solder mask opening, with an extent within the maximum positional deviation of the solder mask;

a second exposed rectangular area adjoining the second straight edge of the solder mask opening, with an extent within the maximum positional deviation of the solder mask; and a constricted intermediate area between the first exposed rectangular area and the second exposed rectangular area;

and wherein the electrically-conductive traces include:

a first unexposed rectangular area contiguous to the first exposed rectangular area and adjoining the first straight edge of the solder mask opening, with an extent within the maximum positional deviation of the solder mask; and a second unexposed rectangular area contiguous to the second exposed rectangular area and adjoining the second straight edge of the solder mask opening, with an extent within the maximum positional deviation of the solder mask.

10. The flip-chip bonding structure of claim 9, wherein the constricted intermediate area is concavely shaped.

11. The flip-chip bonding structure of claim 9, wherein the constricted intermediate area is rectangularly shaped.

12. The flip-chip bonding structure of claim 9, wherein the constricted intermediate area is triangularly shaped.

* * * * *